United States Patent
Pilolli et al.

(10) Patent No.: US 10,658,041 B1
(45) Date of Patent: May 19, 2020

(54) APPARATUS AND METHODS FOR SERIALIZING DATA OUTPUT

(71) Applicant: MICRON TECHNOLOGY, INC., Boise, ID (US)

(72) Inventors: Luigi Pilolli, L'Aquila (IT); Agatino Massimo Maccarrone, Regalbuto (IT); Hoon Choi, Santa Clara, CA (US); Qiang Tang, Cupertino, CA (US); Ali Feiz Zarrin Ghalam, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/205,755

(22) Filed: Nov. 30, 2018

(51) Int. Cl.
| | | |
|---|---|---|
| G11C 7/10 | (2006.01) | |
| G11C 16/10 | (2006.01) | |
| H03M 9/00 | (2006.01) | |
| G11C 16/32 | (2006.01) | |
| G11C 16/04 | (2006.01) | |

(52) U.S. Cl.
CPC .......... *G11C 16/10* (2013.01); *G11C 16/0483* (2013.01); *G11C 16/32* (2013.01); *H03M 9/00* (2013.01); *G11C 2216/30* (2013.01)

(58) Field of Classification Search
CPC ..... G11C 16/10; G11C 16/0483; G11C 16/32; H03M 9/00
USPC .................................................. 365/185.12
See application file for complete search history.

(56) References Cited

U.S. PATENT DOCUMENTS

| | | | | |
|---|---|---|---|---|
| 7,245,240 B1* | 7/2007 | Nguyen | ................. | H03K 5/135 326/46 |
| 7,358,872 B2* | 4/2008 | Morzano | ................. | G11C 7/10 327/407 |
| 7,525,458 B2* | 4/2009 | Morzano | ................. | G11C 7/10 341/100 |
| 7,764,206 B2* | 7/2010 | Morzano | ................. | G11C 7/10 327/407 |
| 8,203,900 B2* | 6/2012 | Lee | ...................... | G11C 7/1048 365/219 |
| 8,243,543 B2* | 8/2012 | Shin | ..................... | G11C 7/1006 365/198 |
| 8,743,642 B2* | 6/2014 | Lee | ...................... | G11C 7/1048 365/189.05 |
| 2007/0046511 A1* | 3/2007 | Morzano | ................. | G11C 7/10 341/101 |
| 2009/0201746 A1* | 8/2009 | Morzano | ................. | G11C 7/10 365/189.05 |

(Continued)

*Primary Examiner* — Xiaochun L Chen
(74) *Attorney, Agent, or Firm* — Dicke, Billig & Czaja, PLLC

(57) ABSTRACT

Methods for serializing data output including receiving a plurality of data values, sequentially providing data values representative of data values of a first subset of data values of the plurality of data values to a first signal line while sequentially providing data values representative of data values of a second subset of data values of the plurality of data values to a second signal line, and providing data values representative of the sequentially-provided data values from the first signal line and providing data values representative of the sequentially-provided data values from the second signal line in an alternating manner to a third signal line, as well as apparatus having a configuration to support such methods.

28 Claims, 12 Drawing Sheets

(56) References Cited

U.S. PATENT DOCUMENTS

| | | | |
|---|---|---|---|
| 2009/0219764 A1* | 9/2009 | Shin | G11C 7/1006 365/189.02 |
| 2011/0007591 A1* | 1/2011 | Lee | G11C 7/1048 365/219 |
| 2012/0243361 A1* | 9/2012 | Lee | G11C 7/1048 365/219 |
| 2013/0083611 A1* | 4/2013 | Ware | G11C 11/4072 365/191 |
| 2018/0083768 A1 | 3/2018 | Chattopadhyay et al. | |

* cited by examiner

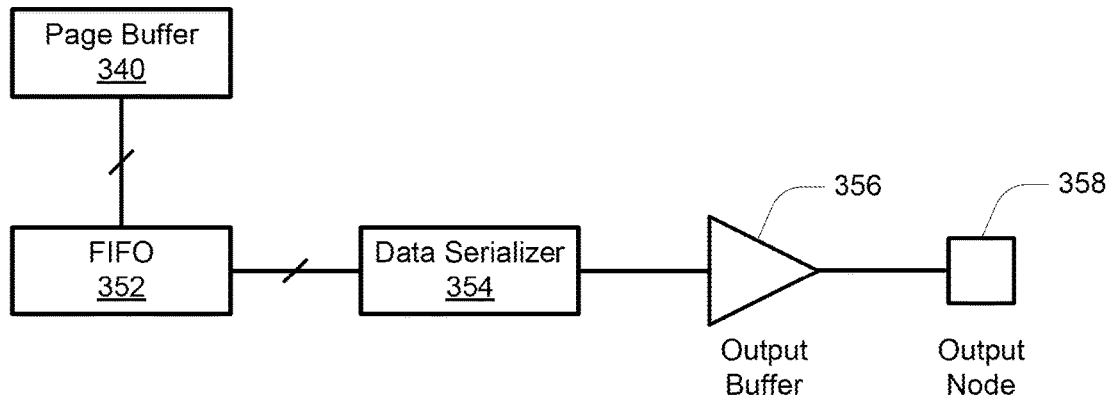
FIG. 3
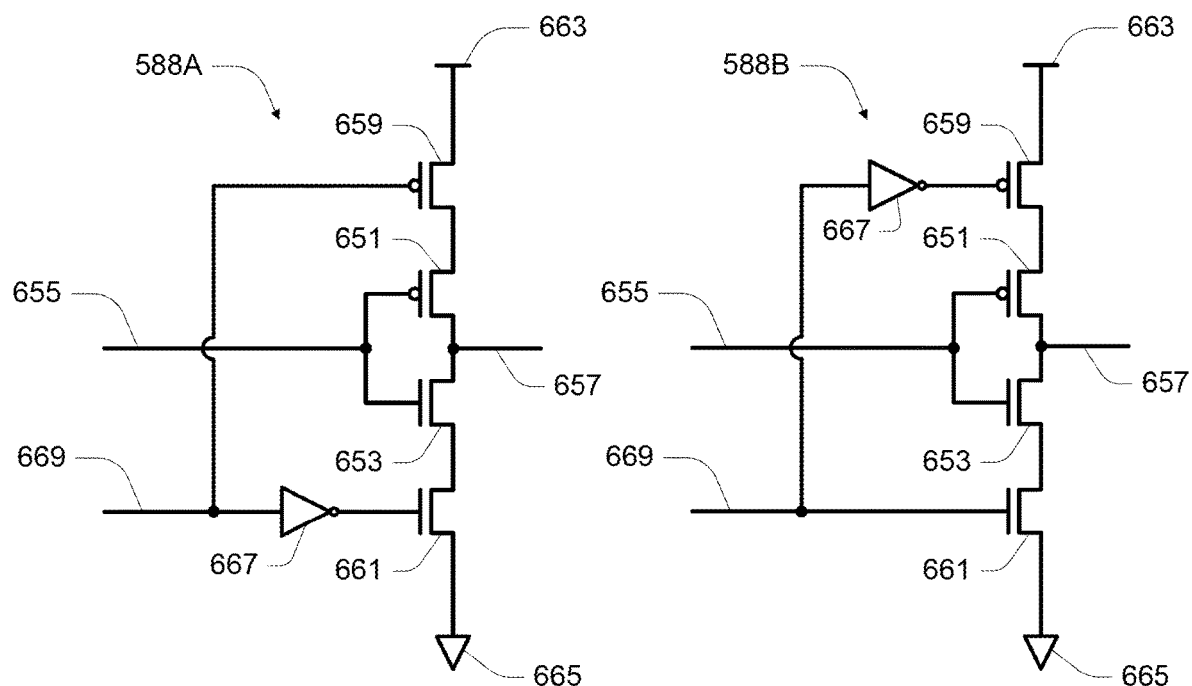
FIG. 6A  FIG. 6B

US 10,658,041 B1

APPARATUS AND METHODS FOR SERIALIZING DATA OUTPUT

TECHNICAL FIELD

The present disclosure relates generally to memory or other integrated circuit devices and, in particular, in one or more embodiments, the present disclosure relates to apparatus and methods for serializing data output.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Although it is common to read data from a memory in parallel from a number of memory cells, this data is often output serially along a number of parallel data output (DQ) lines. As an example, a read operation of a memory might return 16 KB of data values, and these data values might be output from the memory sequentially, or serially, over 16 or 8 DQ lines. For example, a data value for a particular digit (e.g., bit) position of a first data word (e.g., a 16- or 8-bit data word) might be provided to a particular DQ line aligned with a first transition (e.g., rise or fall) of a clock signal, a data value for the particular digit position of a second data word might be provided to the particular DQ line aligned with a second transition of a clock signal, a data value for the particular digit position of a third data word might be provided to the particular DQ line aligned with a third transition of a clock signal, etc. Data values for each additional digit position of each of the data words might be provided to remaining DQ lines aligned with the same transitions of the clock signal. Although output of data might be aligned with transitions of a single clock signal, several clock signals generated from that single clock signal might be used in effecting the serialization of the read data. As data output rates increase, timing of such serialization of data output may become more critical.

BRIEF DESCRIPTION OF THE DRAWINGS

FIG. 3 is a block diagram of an output data path according to an embodiment.

FIGS. 6A-6B are schematics of tri-state inverters as could be used with embodiments.

DETAILED DESCRIPTION

Figure 1:
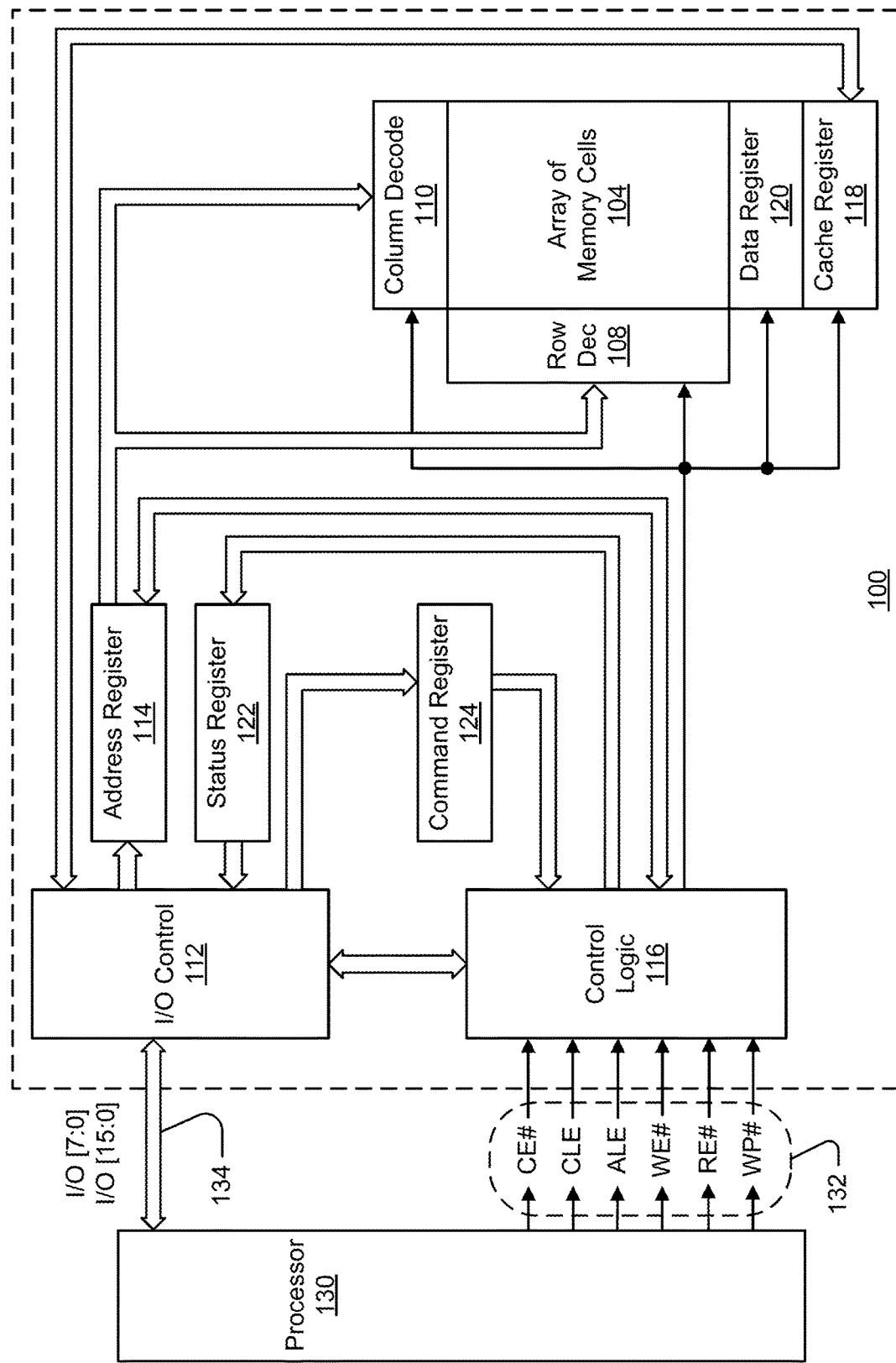
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. The I/O control circuitry 112 may contain one or more data serializers in accordance with embodiments.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
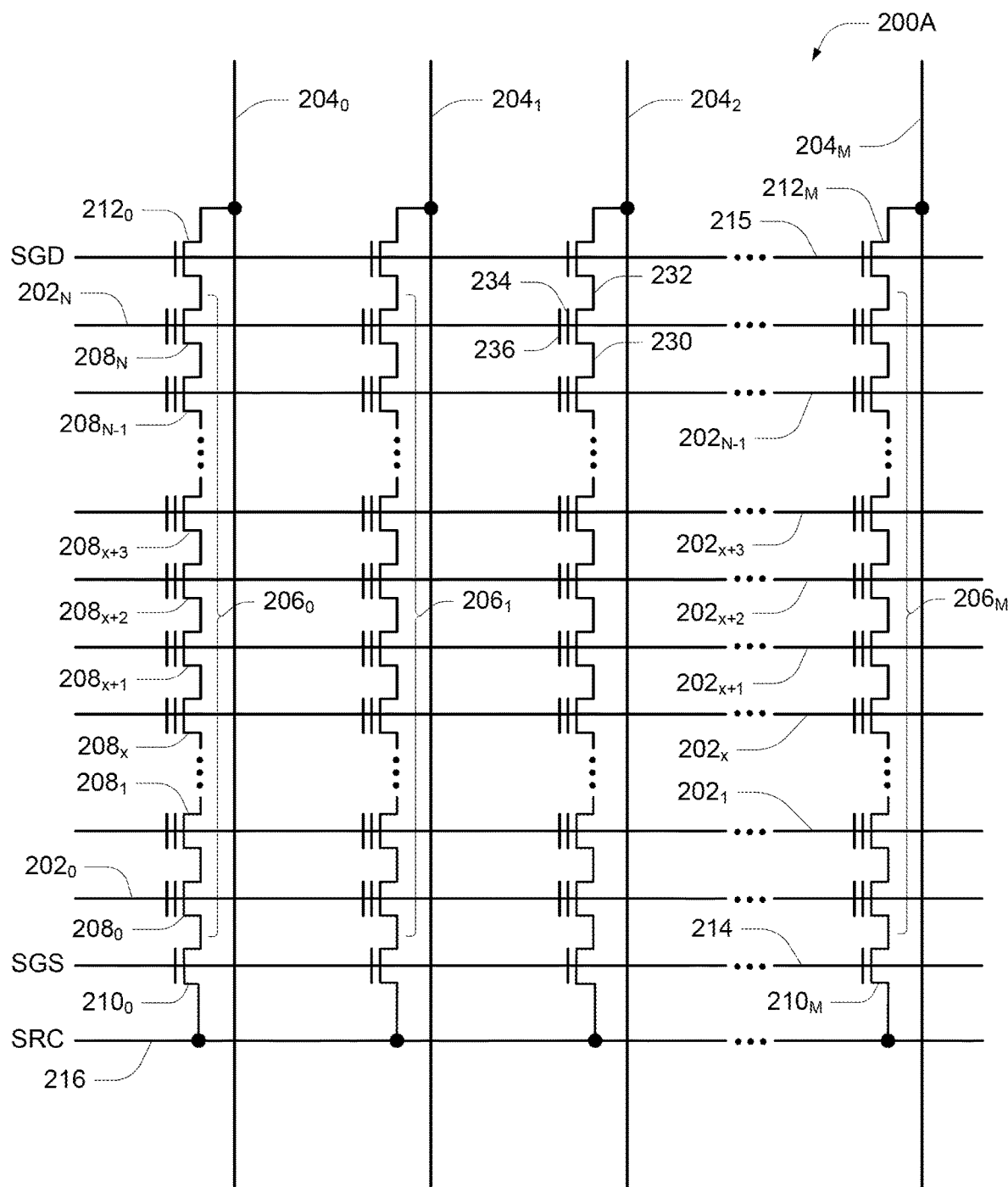
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge, or data structures relying on other physical phenomena, such as phase change or polarization) and other architectures (e.g., AND arrays, NOR arrays, etc.).

Figure 2B:
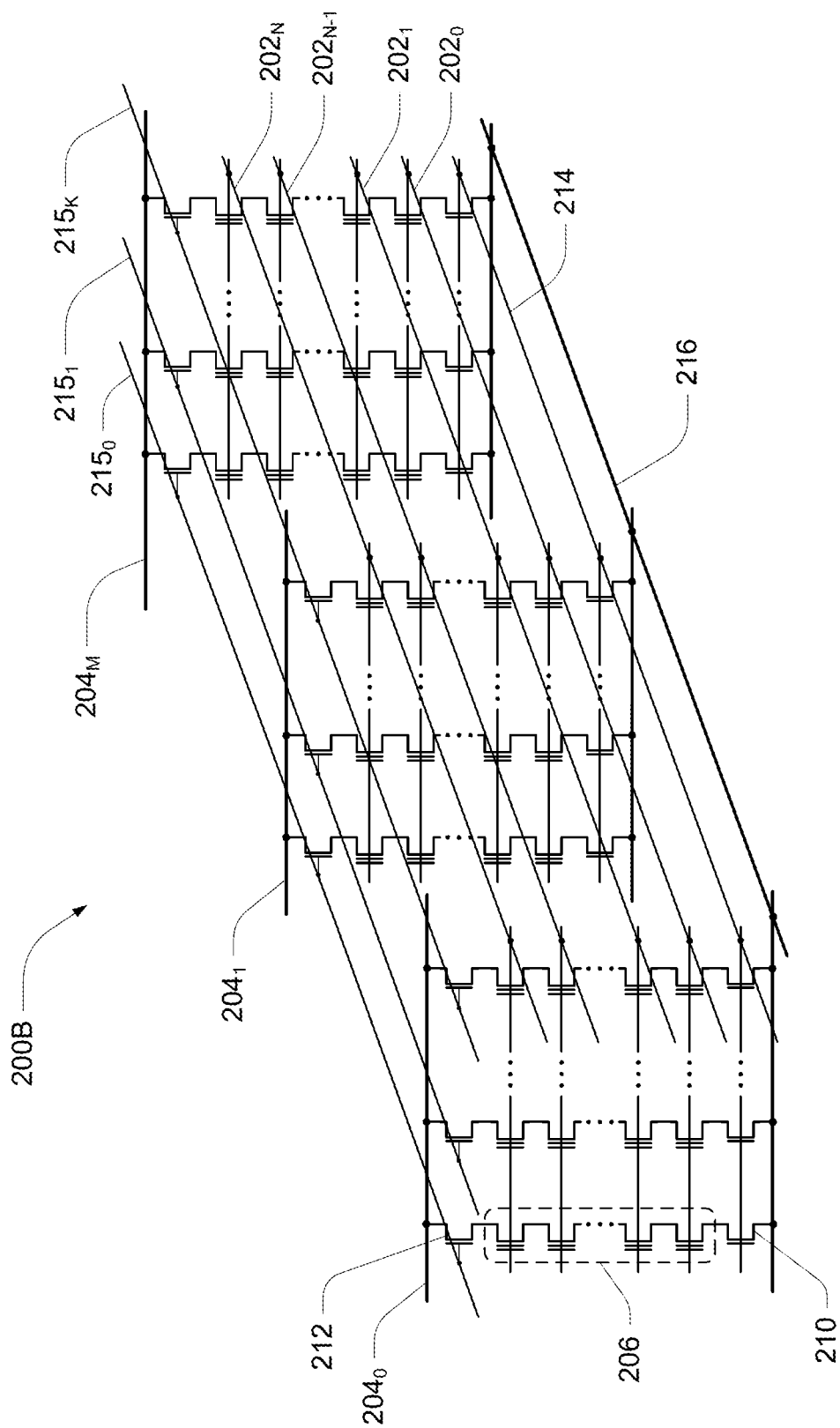

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line 204$_0$-204$_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines 215$_0$-215$_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
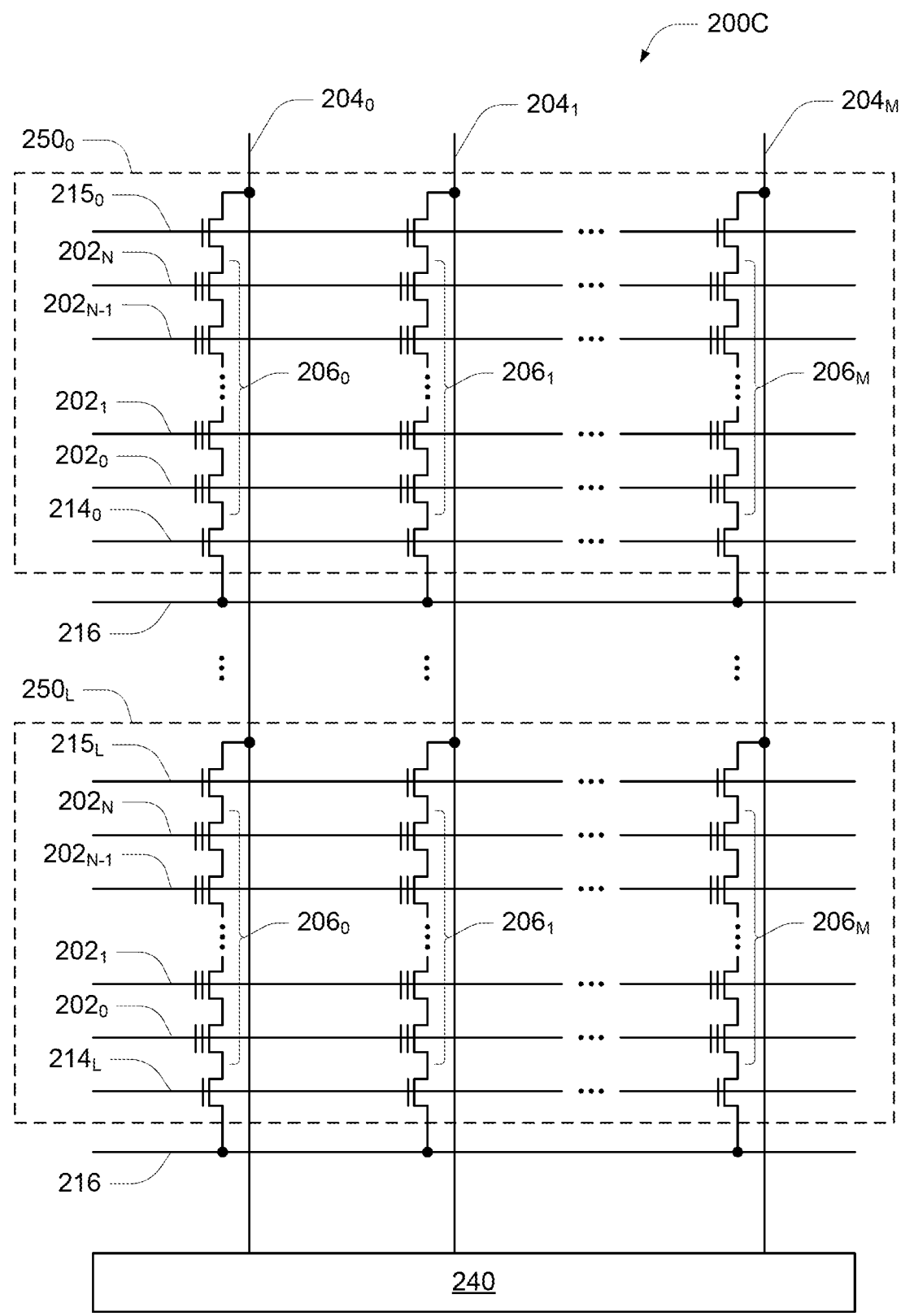

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line 215$_0$. The source 216 for the block of memory cells 250$_0$ might be a same source as the source 216 for the block of memory cells 250$_L$. For example, each block of memory cells 250$_0$-250$_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells 250$_0$-250$_L$.

The data lines 204$_0$-204$_M$ may be connected (e.g., selectively connected) to a buffer portion 240, which might be a portion of a page buffer of the memory. The buffer portion 240 might correspond to a memory plane (e.g., the set of blocks of memory cells 250$_0$-250$_L$). The buffer portion 240 might include sensing devices (not shown) for sensing data values indicated on respective data lines 204, and corresponding registers (not shown) for storage of the sensed data values from its corresponding memory plane.

FIG. 3 is a block diagram of an output data path including a data serializer 354 according to an embodiment. The data path may include a page buffer 340. The page buffer 340 may contain one or more buffer portions 240 such as described with reference to FIG. 2C. Data values (e.g., a portion of the data values) from the page buffer 340 might be provided to a first-in-first-out (FIFO) 352. For example, data values corresponding to a particular digit (e.g., bit) position of a plurality of data words from the page buffer 340 might be provided (e.g., in parallel) to the FIFO 352. The FIFO 352 might continue to receive data values corresponding to the particular digit position for additional pluralities of data words from the page buffer 340, and might provide these data values to the data serializer 354 in a first-in-first-out manner for each plurality of data words. The particular digit position might correspond to a least significant bit (LSB) of a multi-bit data word, a most significant bit (MSB) of that data word, or any remaining bit of that data word. A number of bits in a data word might correspond to the size of the I/O bus 134, for example.

The data serializer 354 might provide the data values corresponding to the particular digit position for a particular plurality of data words sequentially to the output buffer 356. For example, where a plurality of data words includes Y+1 data words (e.g., data word 0 to data word Y), the data serializer 354 might provide the data value corresponding to the particular digit position for data word 0 to the output buffer 356, followed by the data value corresponding to the particular digit position for data word 1, followed by the data value corresponding to the particular digit position for data word 2, and so on. The data serializer 354 might then repeat this process for additional pluralities of data words, e.g., additional pluralities of Y+1 data words.

The output buffer 356 might provide the received data values to an output node 358, e.g., in the order received. The output node 358 might correspond to a conductive node providing for electrical connection between an external device and an integrated circuit device (e.g., a memory) containing the output node 358. For example, the output node 358 might provide for electrical connection of the memory 100 to a corresponding signal line of the I/O bus 134 as described with reference to FIG. 1.

Figure 4A:
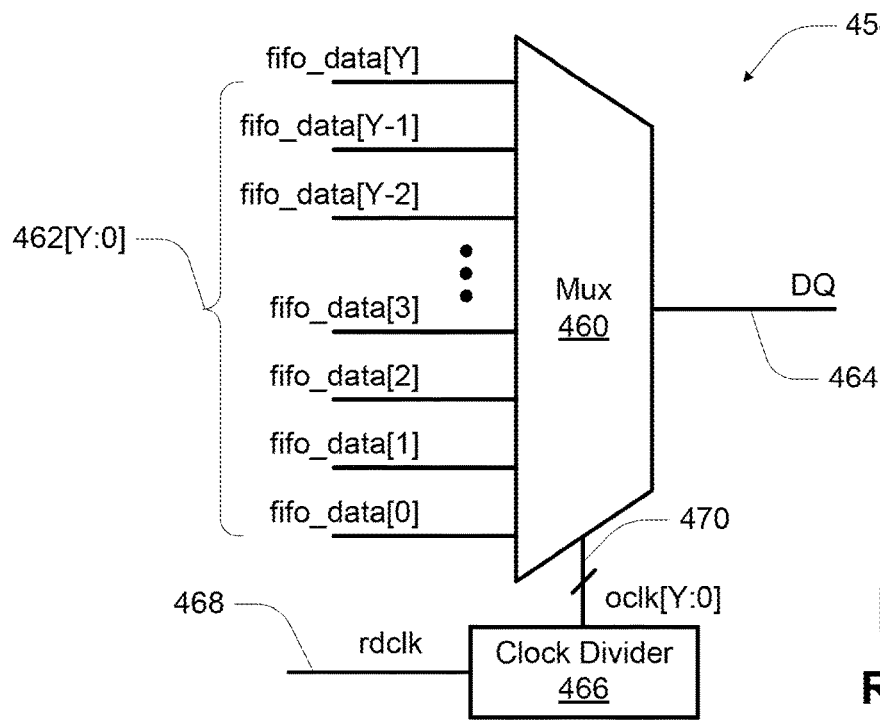
FIG. 4A is a block diagram of a data serializer of the related art.

FIG. 4A is a block diagram of a data serializer 454A of the related art. The data serializer 454A might include a multiplexer (e.g., mux) 460. The multiplexer 460 might be a (Y+1):1 multiplexer, having Y+1 input signal lines 462 (e.g., input signal lines 462$_0$-462$_Y$) configured to receive Y+1 input data values (e.g., fifo_data[0] to fifo_data[Y]), and to output those data values on one output signal line 464. The multiplexer 460 might provide the Y+1 input data values (e.g., fifo_data[0] to fifo_data[Y]) to the signal line 464 serially, e.g., sequentially from fifo_data[0] to fifo_data[Y]. The Y+1 input data values (e.g., fifo_data[0] to fifo_data[Y]) might correspond to data values for a particular digit position of Y+1 data words (e.g., data word 0 to data word Y).

The data serializer 454A might further include a clock divider 466 having an input signal line 468 configured to receive a clock signal, e.g., read clock signal rdclk. The read clock signal rdclk might represent the read enable signal (RE #) received from an external device, e.g., processor 130, or a copy of the read enable signal. The clock divider 466 might be configured to provide the plurality of clock signals oclk[Y:0] to the multiplexer 460 on output signal lines 470. The plurality of clock signals oclk[Y:0] might each have a duty cycle of [2/(Y+1)]. The plurality of clock signals oclk[Y:0] might each have a frequency of [2/(Y+1)] times the frequency of the clock signal rdclk. The plurality of clock signals oclk[Y:0] might further be shifted in phase from one another by [360/(Y+1)] degrees. For example, where the number of input signal lines 462 equals 8 (e.g., Y=7), the clock divider 466 might generate 8 clock signals oclk, where each of these clock signals oclk has a duty cycle of [2/(7+1)] or 25%, where each of these clock signal oclk has a frequency of [2/(7+1)] or ¼ of the frequency of the clock signal rdclk, and wherein each of these clock signals oclk are shifted in phase from one another by [360/(7+1)] or 45 degrees (e.g., phases of 0, 45, 90, 135, 180, 225, 270 and 315 degrees). Each of the clock signals oclk might be provided to a respective signal line 470 in a one-to-one relationship.

Figure 4B:
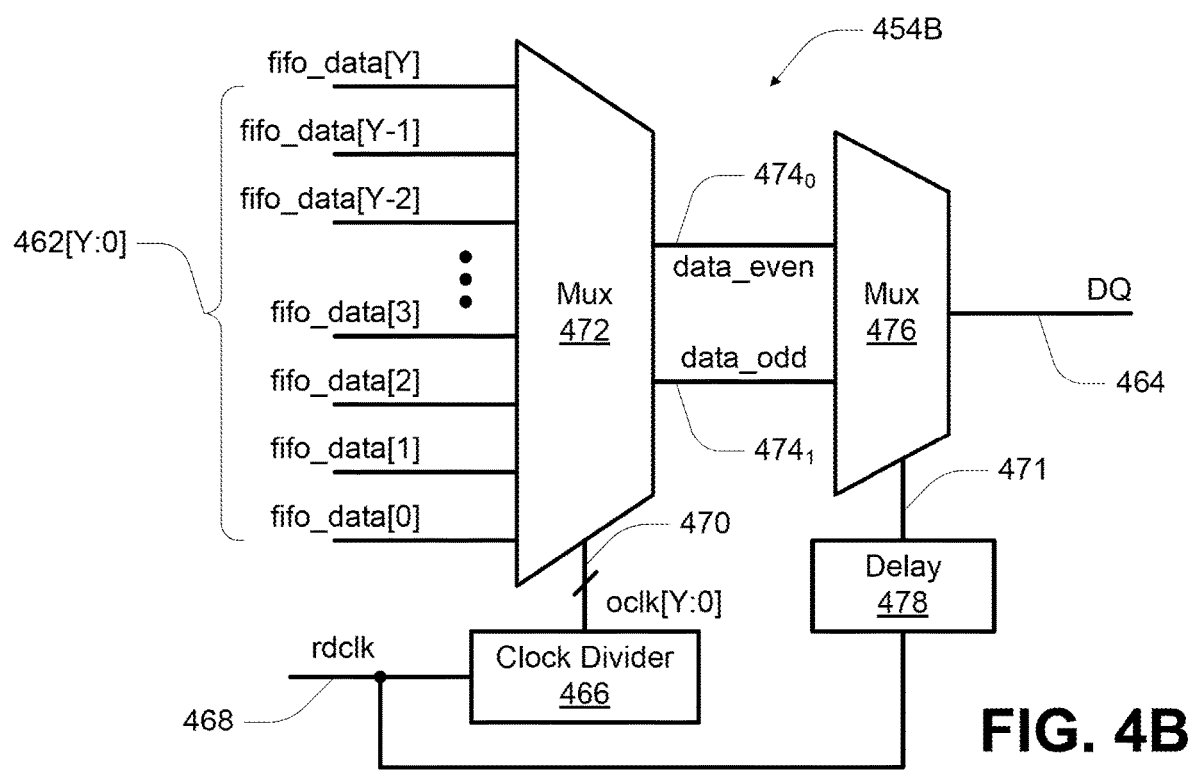
FIG. 4B is a block diagram of a data serializer according to an embodiment.

FIG. 4B is a block diagram of a data serializer 454B according to an embodiment. The data serializer 454B might include a first multiplexer (e.g., mux) 472 and a second multiplexer (e.g., mux) 476. The multiplexer 472 might be a (Y+1):2 multiplexer, having Y+1 input signal lines 462 (e.g., input signal lines $462_0$-$462_Y$) configured to receive Y+1 input data values (e.g., fifo_data[0] to fifo_data[Y]), and two output signal lines 474 (e.g., output signal lines $474_0$ and $474_1$). The multiplexer 476 might be a 2:1 multiplexer, connected to the output signal lines 474 as its input signal lines, and having one output signal line 464.

The multiplexer 472 might provide data values representative of a first subset of the Y+1 input data values (e.g., fifo_data[0] to fifo_data[Y]) to the output $474_0$ serially, and might provide data values representative of a second subset of the Y+1 input data values (e.g., fifo_data[0] to fifo_data[Y]) to the output $474_1$ serially. The first subset of the Y+1 input data values and the second subset of the Y+1 input data values might be mutually exclusive, and a union of the first subset of the Y+1 input data values and the second subset of the Y+1 input data values might be the whole set of Y+1 input data values. For example, the first subset of the Y+1 input data values might be the even data values (e.g., fifo_data[0], fifo_data[2], fifo_data[4], . . . ) while the second subset of the Y+1 input data values might be the odd data values (e.g., fifo_data[1], fifo_data[3], fifo_data[5], . . . ). Note that an even or odd data value does not refer to a value of the data, but to its logical relationship to the other data values. The data values representative of the input data values might be inverted data values of the input data values.

The multiplexer 476 might provide data values representative of the Y+1 input data values (e.g., fifo_data[0] to fifo_data[Y]) to the signal line 464 serially, e.g., sequentially from fifo_data[0] to fifo_data[Y]. The Y+1 input data values (e.g., fifo_data[0] to fifo_data[Y]) might correspond to data values for a particular digit position of Y+1 data words (e.g., data word 0 to data word Y). The multiplexer 476 might be configured to invert the data values received on the signal lines $474_0$ and $474_1$.

The data serializer 454B might further include a clock divider 466 having an input signal line 468 configured to receive a clock signal, e.g., read clock signal rdclk. The clock divider 466 might be configured to provide the plurality of clock signals oclk[Y:0] to the multiplexer 472 on output signal lines 470. The plurality of clock signals oclk[Y:0] might each have a duty cycle of [2/(Y+1)]. The plurality of clock signals oclk[Y:0] might each have a frequency of [2/(Y+1)] times the frequency of the clock signal rdclk. The plurality of clock signals oclk[Y:0] might further be shifted in phase from one another by [360/(Y+1)] degrees. For example, where the number of input signal lines 462 equals 8 (e.g., Y=7), the clock divider 466 might generate 8 clock signals oclk, where each of these clock signals oclk has a duty cycle of [2/(7+1)] or 25%, where each of these clock signal oclk has a frequency of [2/(7+1)] or ¼ of the frequency of the clock signal rdclk, and wherein each of these clock signals oclk are shifted in phase from one another by [360/(7+1)] or 45 degrees (e.g., phases of 0, 45, 90, 135, 180, 225, 270 and 315 degrees). Each of the clock signals oclk might be provided to a respective signal line 470 in a one-to-one relationship.

The data serializer 454B might further include a delay element 478 having an input signal line configured to receive the clock signal, e.g., the read clock signal rdclk, such as from the input signal line 468, and having an output signal line 471 connected to the multiplexer 476. The delay element 478 might be configured to align the transitions of the received clock signal with the transitions of the data on signal lines $474_0$ and $474_1$ as will be described with reference to FIG. 7B.

Figure 5A:
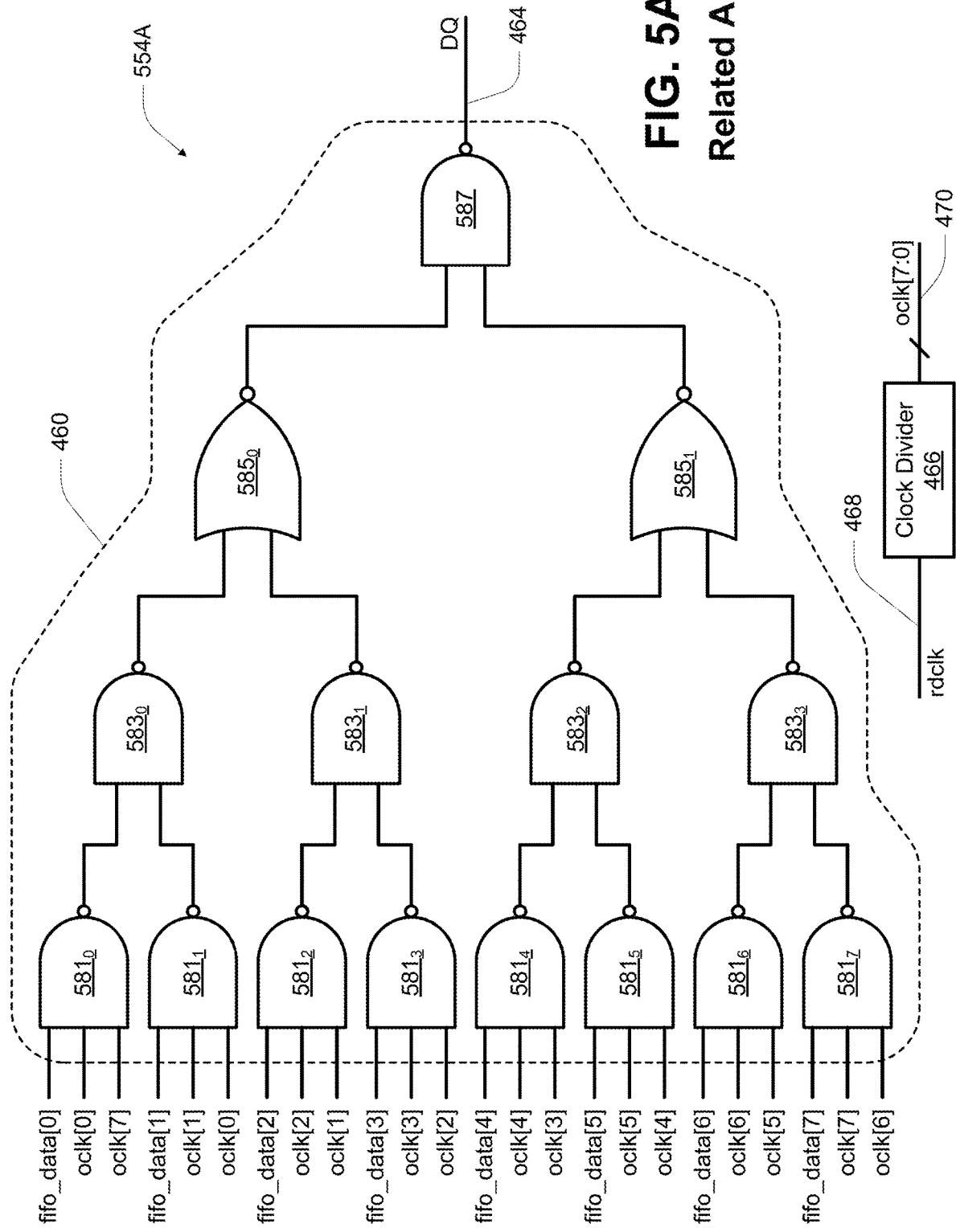
FIG. 5A is a block schematic of a data serializer of the related art.

FIG. 5A is a block schematic of a data serializer 554A of the related art. The data serializer 554A might represent one configuration for providing the (Y+1):1 multiplexer 460 responsive to the Y+1 clock signals oclk[Y:0], where Y=7. The multiplexer 460 of the data serializer 554A might include Y+1 (e.g., 8) NAND gates 581 (e.g., NAND gates $581_0$-$581_7$) each configured to receive as inputs a respective set of two clock signals oclk and a respective input data value fifo_data. The NAND gate $581_0$ is depicted to receive adjacent clock signals oclk[0] and oclk[7] and input data value fifo_data[0], the NAND gate $581_1$ is depicted to receive adjacent clock signals oclk[1] and oclk[0] and input data value fifo_data[1], the NAND gate $581_2$ is depicted to receive adjacent clock signals oclk[2] and oclk[1] and input data value fifo_data[2], and so on. The inputs of the NAND gates 581 configured to receive the data values fifo_data[0] to fifo_data[7] might collectively represent the input signal lines 462. The inputs of the NAND gates 581 configured to receive the clock signals oclk[0] to oclk[7] might collectively represent the output signal lines 470 of the clock divider 466. Note that while each clock signal oclk[Y:0] is received as input to two NAND gates 581, the two instances of inputs for each clock signal oclk[Y:0] may correspond to a single signal line 470.

Outputs of pairs of the NAND gates 581 are provided as inputs to a respective NAND gate 583 (e.g., NAND gates $583_0$-$583_3$). The NAND gate $583_0$ is depicted to receive the outputs of NAND gates $581_0$ and $581_1$, the NAND gate $583_1$ is depicted to receive the outputs of NAND gates $581_2$ and $581_3$, and so on. Outputs of pairs of the NAND gates 583 are provided as inputs to a respective NOR gate 585 (e.g., NOR gates $585_0$-$585_1$). The NOR gate $585_0$ is depicted to receive the outputs of NAND gates $583_0$ and $583_1$, and the NOR gate $585_1$ is depicted to receive the outputs of NAND gates $583_2$ and $583_3$. The outputs of the NOR gates 585 are provided as inputs to the NAND gate 587, whose output might be the signal line 464.

Figure 5B:
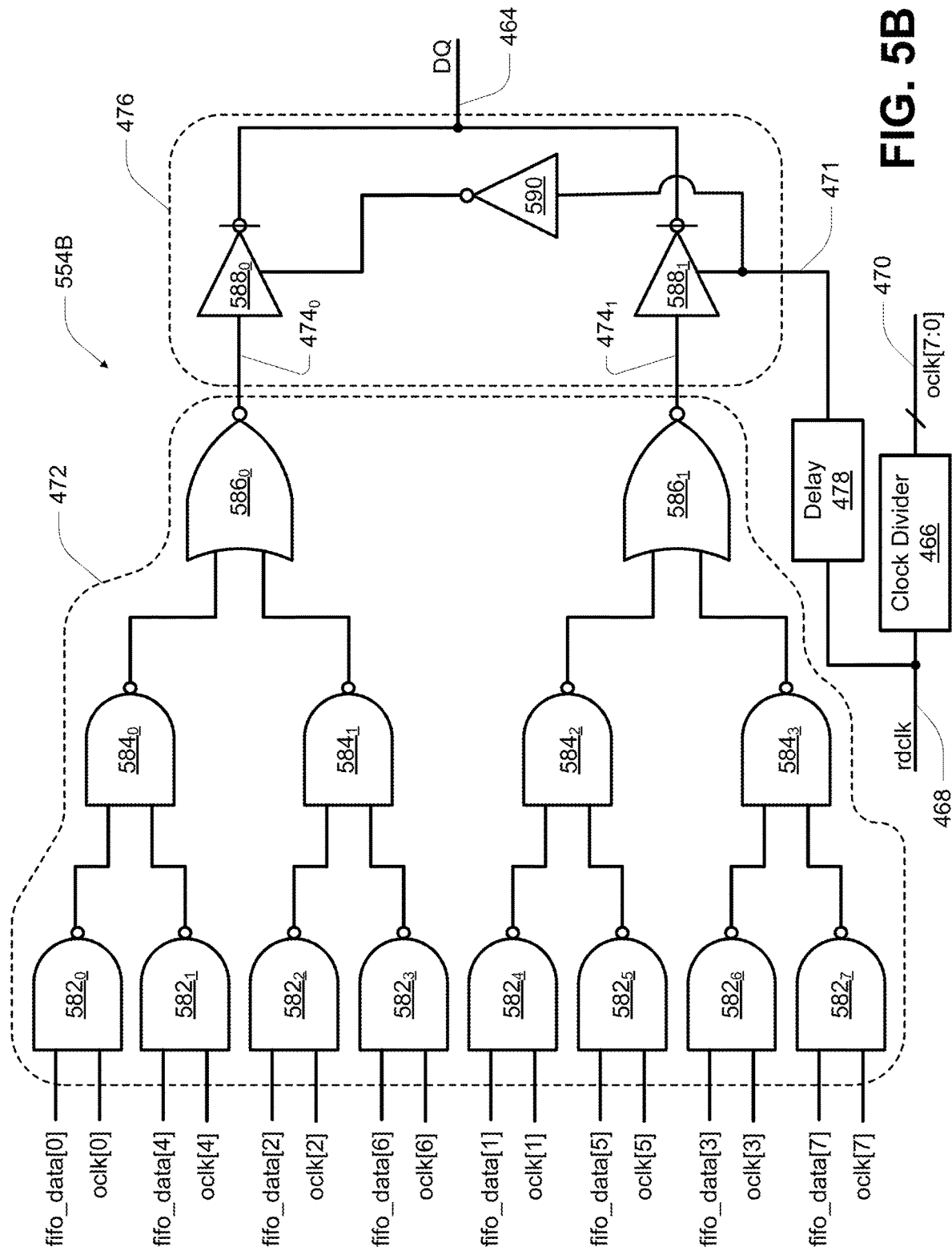
FIG. 5B is a block schematic of a data serializer according to an embodiment.

FIG. 5B is a block schematic of a data serializer 554B according to an embodiment. The data serializer 554B might represent one configuration for providing the (Y+1):2 multiplexer 472 responsive to the Y+1 clock signals oclk[Y:0], where Y=7, and for providing the 2:1 multiplexer 476 responsive to the clock signal rdclk, which might be delayed by the delay element 478. The multiplexer 472 of the data serializer 554B might include Y+1 (e.g., 8) NAND gates 582 (e.g., NAND gates $582_0$-$582_7$) each configured to receive as inputs a respective clock signal oclk and a respective input data value fifo_data. The NAND gate $582_0$ is depicted to receive the clock signal oclk[0] and input data value fifo_data[0], the NAND gate $582_1$ is depicted to receive the clock signal oclk[4] and input data value fifo_data[4], the NAND gate $582_2$ is depicted to receive the clock signal oclk[2] and input data value fifo_data[2], and so on. The inputs of the NAND gates 582 configured to receive the data values fifo_data[0] to fifo_data[7] might collectively represent the input signal lines 462. The inputs of the NAND gates 582 configured to receive the clock signals oclk[0] to oclk[7] might collectively represent the output signal lines 470 of the clock divider 466.

Outputs of pairs of the NAND gates 582 are provided as inputs to a respective NAND gate 584 (e.g., NAND gates $584_0$-$584_3$). The NAND gate $584_0$ is depicted to receive the outputs of NAND gates $582_0$ and $582_1$, the NAND gate $584_1$ is depicted to receive the outputs of NAND gates $582_2$ and $582_3$, and so on. Outputs of pairs of the NAND gates 584 are provided as inputs to a respective NOR gate 586 (e.g., NOR gates $586_0$-$586_1$). The NOR gate $586_0$ is depicted to receive the outputs of NAND gates $584_0$ and $584_1$, and the NOR gate $586_1$ is depicted to receive the outputs of NAND gates $584_2$ and $584_3$. The outputs of the NOR gates $586_0$ and $586_1$ are provided as inputs to the 2:1 multiplexer 476, such as along signal lines $474_0$ and $474_1$, respectively.

In the multiplexer 472, the combinational logic (e.g., NAND gates $582_{0-3}$, NAND gates $584_{0-1}$ and NOR gate $586_0$) connected between the output signal line $474_0$ and the input signal lines connected to receive a first subset of the input data values (e.g., fifo_data[0], fifo_data[2], fifo_data[4], fifo_data[6]), might have a same configuration as the combinational logic (e.g., NAND gates $582_{4-7}$, NAND gates $584_{2-3}$ and NOR gate $586_1$) connected between the output signal line $474_1$ and the input signal lines connected to receive a second subset of the input data values (e.g., fifo_data[1], fifo_data[3], fifo_data[5], fifo_data[7]). A first level of the combinational logic might include logic gates (e.g., NAND gates 582) that are each responsive to (e.g., responsive only to) a respective input data value (e.g., one of fifo_data[7:0]) and a corresponding respective clock signal (e.g., one of oclk[7:0]). Each such combinational logic of the multiplexer 472 might be configured to provide each of its input data values to its corresponding output signal line (e.g., output signal line $474_0$ or $474_1$) sequentially, e.g., when its received clock signals each have a same frequency and are shifted in phase from one another.

It will be apparent from FIG. 5B that the (Y+1):2 multiplexer 472 could be configured as two [(Y+1)/2]:1 multiplexers, with each of the [(Y+1)/2]:1 multiplexers receiving as inputs a subset of the input data values fifo_data[Y:0] and a subset of the clock signals oclk[Y:0], and having an output corresponding to one of the signal lines 474, e.g., signal line $474_0$ or signal line $474_1$. For the example where Y=7, a first 4:1 multiplexer might correspond to NAND gates $582_{0-3}$, NAND gates $584_{0-1}$ and NOR gate $586_0$, while a second 4:1 multiplexer might correspond to NAND gates $582_{4-7}$, NAND gates $584_{2-3}$ and NOR gate $586_1$.

The multiplexer 476 might be configured as a pair of tri-state inverters 588 (e.g., tri-state inverters $588_0$ and $588_1$), whose outputs might be commonly connected to the signal line 464. Each tri-state inverter 588 might be configured to provide an output corresponding to an inverted input signal received on their respective signal line 474 when the received clock signal has a particular logic level (e.g., a logic high level or a logic low level), and to provide a high impedance (e.g., high-Z) when the received clock signal has a different (e.g., opposite) logic level. Where both tri-state inverters 588 are configured to enable their output signals in response to the same logic level, an inverter 590 might be provided to invert the clock signal from the delay element 478 for one of the tri-state inverters 588. The inverter 590 might be eliminated where one tri-state inverter 588 is configured to enable its output signal in response to one logic level of the received clock signal, and the other tri-state inverter 588 is configured to enable its output signal in response to a different logic level of the received clock signal. Elimination of the inverter 590 might be effected by connecting the tri-state inverter $588_0$ to receive its clock signal directly from the signal line 471 similar to the connection to the tri-state inverter $588_1$.

FIGS. 6A-6B are schematics of tri-state inverters 588A and 588B, respectively, as could be used with embodiments. Each of the tri-state inverters 588 has an input signal line 655 connected to control gates of the field-effect transistors (FETs) 651 and 653. As depicted, the FET 651 is a p-type FET, or pFET, having a source/drain (e.g., drain) connected to an output signal line 657, while the FET 653 is an n-type FET, or nFET, having a source/drain (e.g., drain) connected to the output signal line 657. The input signal line 655 might be connected to one of the signal lines 474, while the output signal line 657 might be connected to the output signal line 464, for example.

A second pFET 659 has a source/drain (e.g., source) connected to a voltage node 663, e.g., configured to receive a supply voltage, such as Vcc. The second pFET 659 has a source/drain (e.g., drain) connected to a source/drain (e.g., source) of the first pFET 651. A second nFET 661 has a source/drain (e.g., source) connected to a voltage node 663, e.g., configured to receive a reference voltage, such as Vss, ground or 0V. The second nFET 661 has a source/drain (e.g., drain) connected to a source/drain (e.g., source) of the first nFET 653.

In the tri-state inverter 588A, the control gate of the second pFET 659 might be connected to signal line 669, which might be configured to receive the clock signal from the delay element 478, while the control gate of the second nFET 661 might be connected to receive the output of the inverter 667, which might have an input connected to the signal line 669. In the tri-state inverter 588B, the control gate of the second pFET 659 might be connected to receive the output of the inverter 667, which might have an input connected to the signal line 669, which might be configured to receive the clock signal from the delay element 478, while the control gate of the second nFET 661 might be connected to the signal line 669.

In the examples of FIGS. 6A-6B, the tri-state inverter 588A might be configured to provide a high-impedance to the signal line 657 when the clock signal received on the signal line 669 has a logic high level and to provide an output representing an inverted logic level presented on the signal line 655 when the clock signal received on the signal line 669 has a logic low level. Conversely, the tri-state inverter 588B might be configured to provide a high-impedance to the signal line 657 when the clock signal received on the signal line 669 has a logic low level and to provide an output representing an inverted logic level presented on the signal line 655 when the clock signal received on the signal line 669 has a logic high level.

Figure 7A:
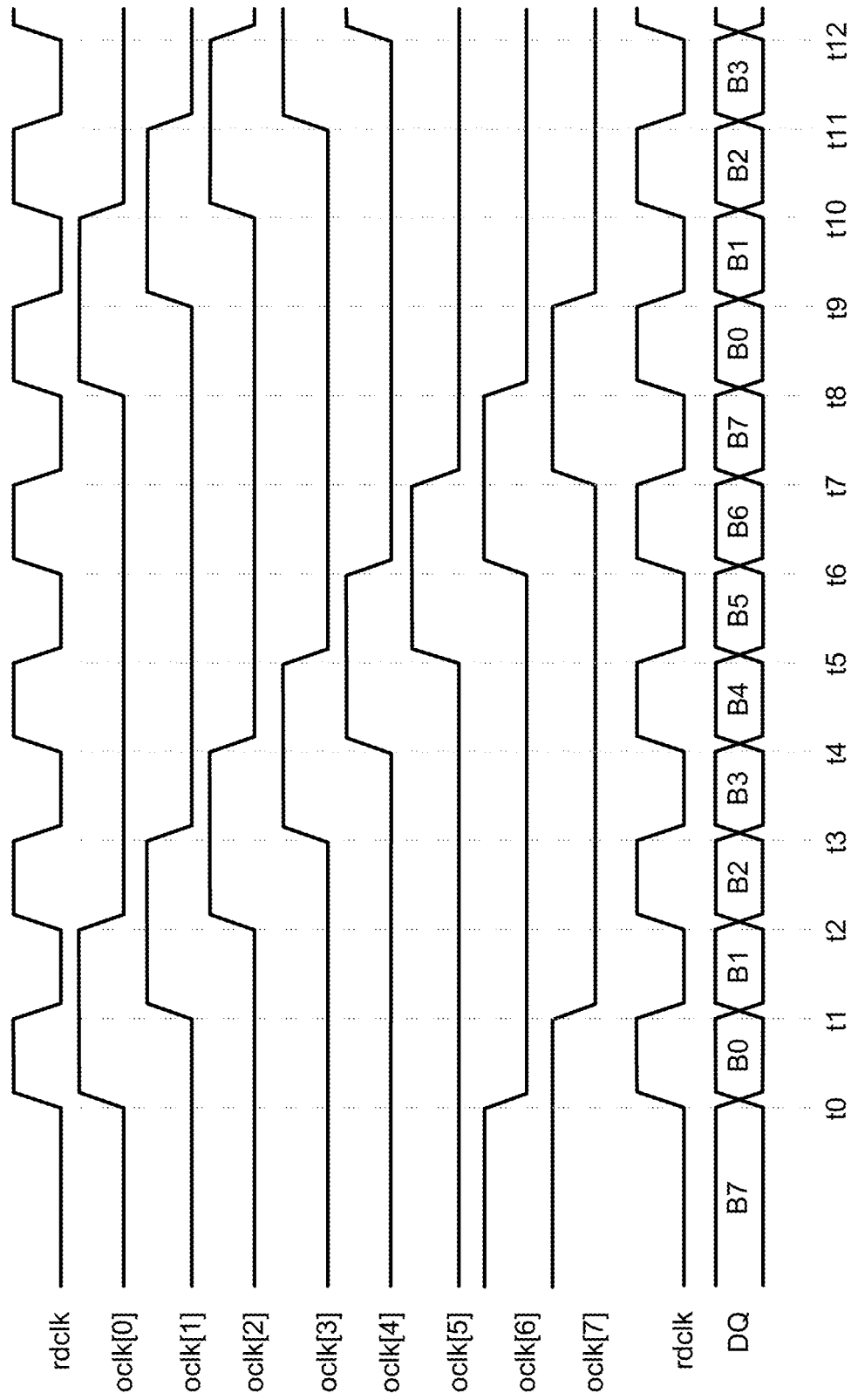
FIG. 7A is a timing diagram of the data serializer of FIG. 5A.

FIG. 7A is a timing diagram of the data serializer 554A of FIG. 5A. The clock signal rdclk (depicted twice for convenience) might represent the clock signal received on input signal line 468 to the clock divider 466. The clock signals oclk[Y:0] might represent the clock signals on the output signal lines 470 of the clock divider 466. The DQ might represent the data values provided on the output signal line 464. At time t0, when the adjacent clock signals oclk[0] and oclk[7] are both logic high levels, the output signal line 464 might present a data value B0 representative of the data value of the input data value fifo_data[0]. At time t1, when the adjacent clock signals oclk[1] and oclk[0] are both logic high levels, the output signal line 464 might present a data value B1 representative of the data value of the input data value fifo_data[1]. At time t2, when the adjacent clock signals oclk[2] and oclk[1] are both logic high levels, the output signal line 464 might present a data value B2 representative of the data value of the input data value fifo_data[2], and so on. The timing diagram of FIG. 7A might be conceptual, and may presume, for example, a condition where there is no delay between the input and the output of the multiplexer 460.

In the data serializer 554A of FIG. 5A, there are eight different paths between the input data values fifo_data[Y:0] and the output signal line 464, controlled by a combination of eight different enable signals, e.g., clock signals oclk[Y:0], generated by a single input clock signal, and switching every half clock cycle of that input clock signal, e.g., the clock signal rdclk. Any path-to-path variation in propagation delay may adversely affect the data window and duty cycle of the output data DQ due to increasing amounts of jitter. Various embodiments seek to mitigate jitter.

Figure 7B:
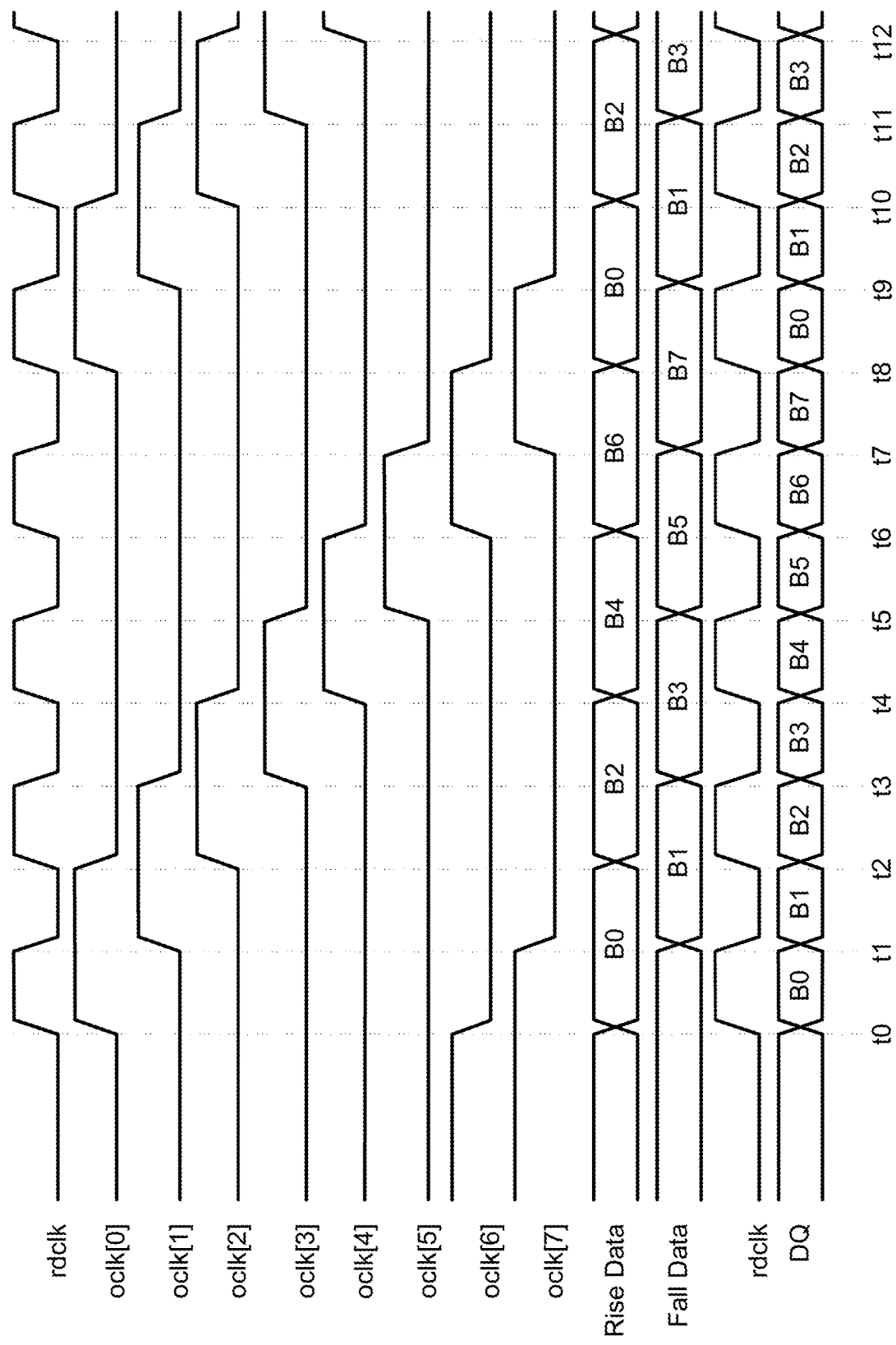
FIG. 7B is a timing diagram of the data serializer of FIG. 5B.

FIG. 7B is a timing diagram of the data serializer 554B of FIG. 5B. For the example of FIG. 7B, the tri-state inverters 588 of FIG. 5B might each have the configuration of the tri-state inverter 588A of FIG. 6A. The clock signal rdclk (depicted twice for convenience) might represent the clock signal received on input signal line 468 to the clock divider 466. The clock signals oclk[Y:0] might represent the clock signals on the output signal lines 470 of the clock divider 466. The Rise Data might represent the data values (e.g., even data values) provided on the signal line $474_0$, and the Fall Data might represent the data values (e.g., odd data values) provided on the signal line $474_1$. In the example of FIG. 5B, the Rise Data might correspond to even data values fifo_data[0], fifo_data[2], fifo_data[4], and fifo_data[6], while the Fall Data might correspond to odd data values fifo_data[1], fifo_data[3], fifo_data[5], and fifo_data[7]. The DQ might represent the data values provided on the output signal line 464. The timing diagram of FIG. 7B might be conceptual, and may presume, for example, a condition where there is no delay between the input of the multiplexer 472 and the output of the multiplexer 476.

At time t0 to t2, in response to the clock signal oclk[0] having a logic high level, the output signal line $474_0$ might present a data value B0 representative of the data value of the input data value fifo_data[0]. At time t2 to t4, in response to the clock signal oclk[2] having a logic high level, the output signal line $474_0$ might present a data value B2 representative of the data value of the input data value fifo_data[2]. At time t4 to t6, in response to the clock signal oclk[4] having a logic high level, the output signal line $474_0$ might present a data value B4 representative of the data value of the input data value fifo_data[4]. At time t6 to t8, in response to the clock signal oclk[6] having a logic high level, the output signal line $474_0$ might present a data value B6 representative of the data value of the input data value fifo_data[0]. This process might then repeat for a next set of data values, e.g., from a different plurality of data words.

Similarly, at time t1 to t3, in response to the clock signal oclk[1] having a logic high level, the output signal line $474_1$ might present a data value B1 representative of the data value of the input data value fifo_data[1]. At time t3 to t5, in response to the clock signal oclk[3] having a logic high level, the output signal line $474_1$ might present a data value B3 representative of the data value of the input data value fifo_data[3]. At time t5 to t7, in response to the clock signal oclk[5] having a logic high level, the output signal line $474_1$ might present a data value B5 representative of the data value of the input data value fifo_data[5]. At time t7 to t9, in response to the clock signal oclk[7] having a logic high level, the output signal line $474_1$ might present a data value B7 representative of the data value of the input data value fifo_data[7]. This process might then repeat for a next set of data values, e.g., from a different plurality of data words.

With the generation of the Rise Data (e.g., even data) and the Fall Data (e.g., odd data), the multiplexer 476, responsive to the clock signal rdclk, might alternately provide one or the other to the output signal line 464, e.g., in response to the rise or fall, respectively, of the clock signal rdclk transitions (e.g., the clock edges). The delay 478 might be configured to delay the input clock signal rdclk to align the delayed clock signal rdclk received at the multiplexer 476 to a transition between data values provided on signal line $474_0$ and/or $474_1$.

In the data serializer 554B of FIG. 5B, there are four different paths between the input data values fifo_data[0], fifo_data[2], fifo_data[4], and fifo_data[6], and the output signal line $474_0$, controlled by a combination of four different enable signals, e.g., clock signals oclk[0], oclk[2], oclk[4] and oclk[6], generated by a single input clock signal, and switching every one clock cycle of that input clock signal, e.g., the clock signal rdclk. Similarly, there are four different paths between the input data values fifo_data[1], fifo_data[3], fifo_data[5], and fifo_data[7], and the output signal line $474_1$, controlled by a combination of four different enable signals, e.g., clock signals oclk[1], oclk[3], oclk[5] and oclk[7], generated by the single input clock signal, and switching every one clock cycle of that input clock signal, e.g., the clock signal rdclk. However, the paths from Rise Data and Fall Data to the output data DQ across the multiplexer 476 are controlled by a single enable signal, e.g., the clock signal rdclk, which might be delayed. This may facilitate a mitigation in jitter over the related art as the 2:1 multiplexer 476 may mask any effects of jitter from the 8:2 multiplexer 472, such that jitter sources might be effectively limited to only two paths (e.g., Rise Data to DQ and Fall Data to DQ) rather than eight in the example of the related art for eight input data values fifo_data[7:0].

This mitigation might be more significant where the number of input data values is higher. For example, if the number of input data values were sixteen, the multiplexer 460 of the data serializer 454A of FIG. 4A might be a 16:1 multiplexer, having sixteen data paths controlled by a combination of sixteen different enable signals. Comparatively, while the multiplexer 472 of FIG. 4B might be a 16:2 multiplexer in this example, the multiplexer 476 might remain a 2:1 multiplexer, which might again effectively limit the jitter sources to only two paths.

Figure 8:
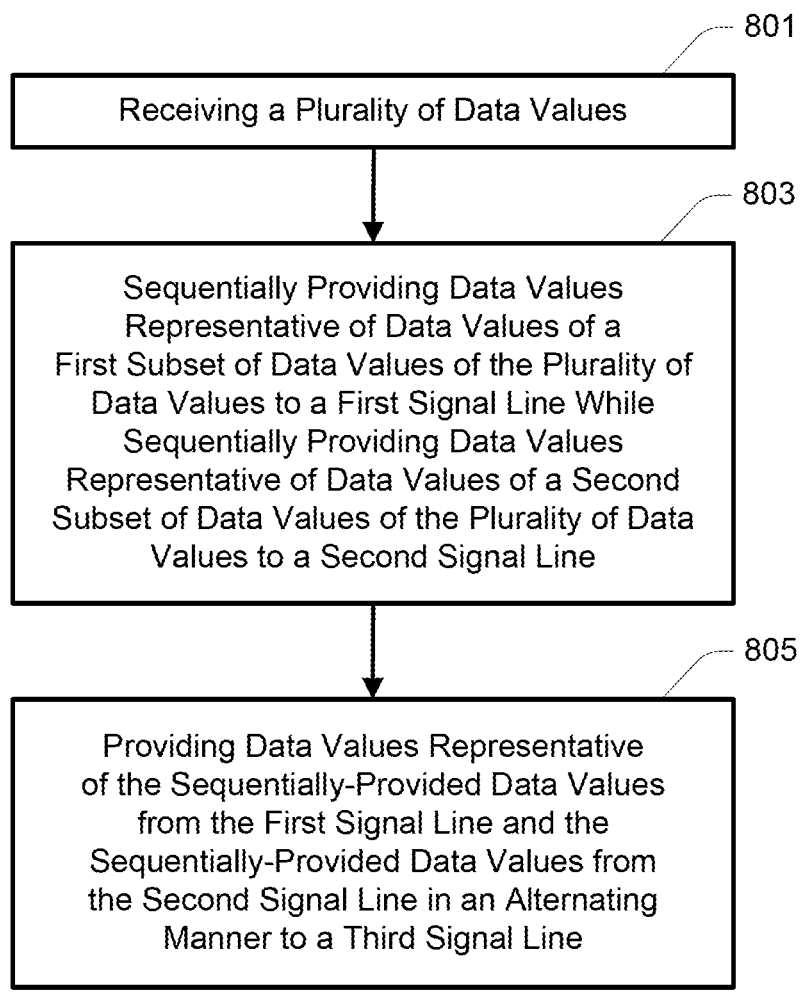
FIG. 8 is a flowchart of a method of operating a memory in accordance with an embodiment.

FIG. 8 is a flowchart of a method of operating a memory in accordance with an embodiment. At 801, a plurality of data values are received. The plurality of data values might correspond to a particular digit (e.g., bit) position of a plurality of data words. The data words might each contain a plurality of digit positions. The number of digit positions might correspond to a number of output nodes 358 used for outputting data (e.g., parallel data) across the I/O bus 134.

At 803, data values representative of data values of a first subset of data values of the plurality of data values are sequentially provided to a first signal line while data values representative of data values of a second subset of data values of the plurality of data values are sequentially provided to a second signal line. For example, the first subset of data values might correspond to the even data values of the plurality of data values, while the second subset of data values might correspond to the odd data values of the plurality of data values, or vice versa. The first signal line might correspond to the output signal line $474_0$ of a Y:2 multiplexer 472, and the second signal line might correspond to the output signal line $474_1$ of the Y:2 multiplexer 472. The data values representative of data values of the first subset of data values might be inverted data values of the first subset of data values, and the data values representative of data values of the second subset of data values might be inverted data values of the second subset of data values.

At 805, data values representative of the sequentially-provided data values of the first subset of data values and data values representative of the sequentially-provided data values of the second subset of data values are provided to a third signal line in an alternating manner. For example, a data value representative of a first data value from the first signal line might be provided to the third signal line, then a data value representative of a first data value from the second signal line might be provided to the third signal line, then a data value representative of a second data value from the first signal line might be provided to the third signal line, then a data value representative of a second data value from the second signal line might be provided to the third signal line, and so on. The third signal line might correspond to the output signal line 464 of the multiplexer 476. The first subset of data values might correspond to data values of the plurality of data values to be provided to the third signal line in response to a particular transition (e.g., a rise or fall) of a clock signal, while the second subset of data values might correspond to data values of the plurality of data values to be provided to the third signal line in response to a different transition (e.g., a fall or rise, respectively) of the clock signal.

Figure 9:
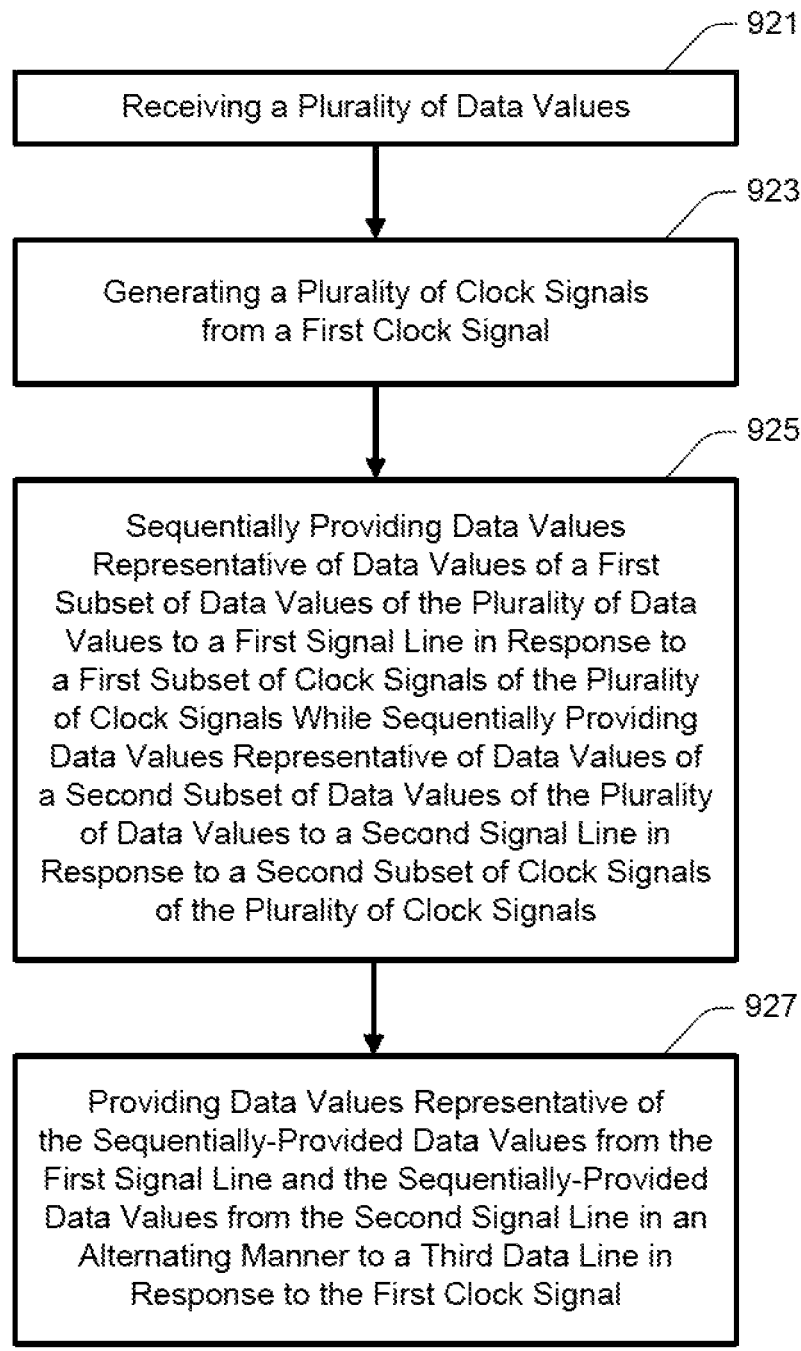
FIG. 9 is a flowchart of a method of operating a memory in accordance with another embodiment.

FIG. 9 is a flowchart of a method of operating a memory in accordance with another embodiment. At 921, a plurality of data values are received. The plurality of data values might correspond to a particular digit (e.g., bit) position of a plurality of data words. The data words might each contain a plurality of digit positions. The number of digit positions might correspond to a number of output nodes 358 used for outputting data (e.g., parallel data) across the I/O bus 134.

At 923, a plurality of clock signals are generated from a first clock signal. The first clock signal might represent the read clock signal rdclk provided to the clock divider 466, which might represent the read enable signal (RE #) received from an external device, e.g., processor 130, or a copy of the read enable signal. The plurality of clock signals might represent the clock signals oclk[Y:0] generated by the clock divider 466, and provided to the Y:2 multiplexer 472 on output signal lines 470.

At 925, data values representative of data values of a first subset of data values of the plurality of data values are sequentially provided to a first signal line in response to a first subset of clock signals of the plurality of clock signals, while data values of a second subset of data values of the plurality of data values are sequentially provided to a second signal line in response to a second subset of clock signals of the plurality of clock signals. For example, the first subset of clock signals might correspond to the even clock signals of the plurality of clock signals, e.g., the clock signals oclk[0], oclk[2], oclk[4], and so on, while the second subset of clock signals might correspond to the odd clock signals of the plurality of clock signals, e.g., the clock signals oclk[1], oclk[3], oclk[5], and so on, or vice versa. In addition, the first subset of data values might correspond to the even data values of the plurality of data values, while the second subset of data values might correspond to the odd data values of the plurality of data values, or vice versa. The first signal line might correspond to the output signal line 474$_0$ of a Y:2 multiplexer 472, and the second signal line might correspond to the output signal line 474$_1$ of the Y:2 multiplexer 472. The data values representative of the data values of the first subset of data values might be inverted data values of the first subset of data values, while the data values representative of the data values of the second subset of data values might be inverted data values of the second subset of data values.

At 927, data values representative of the sequentially-provided data values from the first signal line and the sequentially-provided data values from the second signal line are provided to a third data line in an alternating manner. For example, a data value representative of a first data value from the first signal line might be provided to the third signal line, then a data value representative of a first data value from the second signal line might be provided to the third signal line, then a data value representative of a second data value from the first signal line might be provided to the third signal line, then a data value representative of a second data value from the second signal line might be provided to the third signal line, and so on. The third signal line might correspond to the output signal line 464 of the 2:1 multiplexer 476. The first subset of data values might correspond to data values of the plurality of data values to be provided to the third signal line in response to a particular transition (e.g., a rise or fall) of the first clock signal, while the second subset of data values might correspond to data values of the plurality of data values to be provided to the third signal line in response to a different transition (e.g., a fall or rise, respectively) of the first clock signal. Providing data values to the third data line may be responsive to a delayed first clock signal. The data values representative of the sequentially-provided data values from the first signal line might be inverted data values of the sequentially-provided data values from the first signal line, and the data values representative of the sequentially-provided data values from the second signal line might be inverted data values of the sequentially-provided data values from the second signal line.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
   a first multiplexer comprising a plurality of input signal lines, a first output signal line and a second output signal line, wherein each input signal line of the plurality of input signal lines is configured to receive a data value to be output from the apparatus, and wherein the first multiplexer is configured to provide data values representative of the data values for a first subset of input signal lines of the plurality of input signal lines to the first output signal line and to provide data values representative of the data values for a second subset of input signal lines of the plurality of input signal lines to the second output signal line;
   a second multiplexer comprising a first input signal line, a second input signal line and an output signal line, wherein the first input signal line of the second multiplexer is configured to receive the data values from the first output signal line of the first multiplexer, wherein the second input signal line of the second multiplexer is configured to receive the data values from the second output signal line of the first multiplexer, and wherein the second multiplexer is configured to selectively provide data values representative of the data values from its first input signal line or its second input signal line to its output signal line; and an output node configured to receive data values from the output signal line of the second multiplexer;

wherein the first multiplexer comprises a first combinational logic connected between its first output signal line and the first subset of input signal lines, and a second combinational logic connected between its second output signal line and the second subset of input signal lines;

wherein a first level of the first combinational logic comprises a first plurality of NAND gates that are each configured to be responsive to a respective input data value of the first subset of input signal lines and a corresponding respective clock signal of a first subset of clock signals of a plurality of clock signals; and wherein a first level of the second combinational logic comprises a second plurality of NAND gates that are each configured to be responsive to a respective input data value of the second subset of input signal lines and a corresponding respective clock signal of a second subset of clock signals of the plurality of clock signals.

2. The apparatus of claim 1, further comprising:

a clock divider configured to receive a first clock signal and to generate a plurality of clock signals responsive to the first clock signal;

wherein each clock signal of the plurality of clock signals is shifted in phase from one another.

3. The apparatus of claim 2, wherein the first multiplexer is configured to be responsive to the plurality of clock signals to sequentially provide the data values representative of the data values for the first subset of input signal lines to the first output signal line and to sequentially provide the data values representative of the data values for the second subset of input signal lines to the second output signal line, and wherein the second multiplexer is configured to be responsive to the first clock signal to provide data values representative of the data values from the first output signal line and the second output signal line of the first multiplexer to its output signal line in an alternating manner responsive to the first clock signal.

4. The apparatus of claim 3, further comprising a delay to delay the first clock signal, and wherein the second multiplexer is responsive to the delayed first clock signal.

5. The apparatus of claim 2, wherein each clock signal of the plurality of clock signals has a same frequency and a same duty cycle.

6. The apparatus of claim 2, wherein the plurality of clock signals contains N clock signals, and wherein the clock divider is configured to generate the plurality of clock signals such that each clock signal of the N clock signals has a duty cycle of 2/N, each clock signal of the N clock signals has a frequency of 2/N times a frequency of the first clock signal, and the clock signals of the N clock signals are shifted in phase from one another by 360/N degrees.

7. The apparatus of claim 6, wherein the first multiplexer is a N:2 multiplexer.

8. The apparatus of claim 7, wherein the N:2 multiplexer is configured as two (N/2):1 multiplexers.

9. The apparatus of claim 1, wherein the first combinational logic and the second combinational logic have a same configuration.

10. The apparatus of claim 1, wherein the second multiplexer comprises:

a first tri-state inverter having an input connected to receive data values from the first output signal line of the first multiplexer, and having an output connected to the output signal line of the second multiplexer; and a second tri-state inverter having an input connected to receive data values from the second output signal line of the first multiplexer, and having an output connected to the output signal line of the second multiplexer.

11. The apparatus of claim 10, wherein the first tri-state inverter is configured to provide an inverted received data value to its output in response to a clock signal having a first logic level and to provide a high impedance on its output in response to the clock signal having a second logic level, and wherein the second tri-state inverter is configured to provide an inverted received data value to its output in response to the clock signal having the second logic level and to provide a high impedance on its output in response to the clock signal having the first logic level.

12. The apparatus of claim 10, further comprising an inverter, wherein the first tri-state inverter and the second tri-state inverter have a same configuration, and wherein the inverter is connected between a clock input of the first tri-state inverter and a clock input of the second tri-state inverter.

13. The apparatus of claim 1, further comprising:

an array of memory cells;

a page buffer configured to store data values sensed from the array of memory cells; and a first-in-first-out configured to receive pluralities of data values from the page buffer and to provide the received pluralities of data values to the plurality of input signal lines of the first multiplexer on a first-in-first-out basis.

14. The apparatus of claim 13, wherein the data values of each plurality of data values of the pluralities of data values correspond to a particular digit position of a respective plurality of data words stored in the page buffer.

15. A method, comprising:

receiving a plurality of data values;

generating a plurality of clock signals from a first clock signal;

delaying the first clock signal to generate a delayed first clock signal, wherein transitions of the delayed first clock signal are delayed relative to transitions of the plurality of clock signals;

sequentially providing data values representative of data values of a first subset of data values of the plurality of data values to a first signal line in response to a first subset of clock signals of the plurality of clock signals while sequentially providing data values representative of data values of a second subset of data values of the plurality of data values to a second signal line in response to a second subset of clock signals of the plurality of clock signals; and providing data values representative of the sequentially-provided data values from the first signal line and providing data values representative of the sequentially-provided data values from the second signal line in an alternating manner to a third signal line in response to the delayed first clock signal.

16. The method of claim 15, wherein sequentially providing the data values representative of the data values of the first subset of data values to the first signal line comprises sequentially providing data values representative of even data values of the plurality of data values to the first signal line, and wherein sequentially providing the data values representative of the data values of the second subset of data values to the second signal line comprises sequentially providing data values representative of odd data values of the plurality of data values to the second signal line.

17. The method of claim 15, wherein generating the plurality of clock signals comprises generating N clock signals, such that each clock signal of the N clock signals has a duty cycle of 2/N, each clock signal of the N clock signals has a frequency of 2/N times a frequency of the first clock signal, and the clock signals of the N clock signals are shifted in phase from one another by 360/N degrees.

18. The method of claim 17, wherein sequentially providing the data values representative of the data values of the first subset of data values to the first signal line responsive to the first subset of clock signals comprises sequentially providing the data values representative of the data values of the first subset of data values to the first signal line responsive to even clock signals of the plurality of clock signals, and wherein sequentially providing the data values representative of the data values of the second subset of data values to the second signal line responsive to the second subset of clock signals comprises sequentially providing the data values representative of the data values of the second subset of data values to the second signal line responsive to odd clock signals of the plurality of clock signals.

19. The method of claim 15, wherein receiving the plurality of data values comprises receiving data values corresponding to a particular digit position of a plurality of data words.

20. The method of claim 15, wherein sequentially providing the data values representative of the data values of the first subset of data values to the first signal line comprises sequentially providing inverted data values of the first subset of data values, and wherein sequentially providing the data values representative of the data values of the second subset of data values to the second signal line comprises sequentially providing inverted data values of the second subset of data values.

21. The method of claim 15, wherein providing the data values representative of the sequentially-provided data values from the first signal line comprises providing inverted data values of the sequentially-provided data values from the first signal line, and wherein providing the data values representative of the sequentially-provided data values from the second signal line comprises providing inverted data values of the sequentially-provided data values from the second signal line.

22. An apparatus, comprising:
a clock divider configured to receive a first clock signal and to generate a plurality of clock signals responsive to the first clock signal;
a delay configured to delay the first clock signal to generate a delayed first clock signal;
a first multiplexer comprising a plurality of input signal lines, a first output signal line and a second output signal line, wherein each input signal line of the plurality of input signal lines is configured to receive a data value to be output from the apparatus, and wherein the first multiplexer is configured to provide data values representative of the data values for a first subset of input signal lines of the plurality of input signal lines to the first output signal line and to provide data values representative of the data values for a second subset of input signal lines of the plurality of input signal lines to the second output signal line;
a second multiplexer comprising a first input signal line, a second input signal line and an output signal line, wherein the first input signal line of the second multiplexer is configured to receive the data values from the first output signal line of the first multiplexer, wherein the second input signal line of the second multiplexer is configured to receive the data values from the second output signal line of the first multiplexer, and wherein the second multiplexer is configured to selectively provide data values representative of the data values from its first input signal line or its second input signal line to its output signal line; and
an output node configured to receive data values from the output signal line of the second multiplexer;
wherein each clock signal of the plurality of clock signals is shifted in phase from one another;
wherein the delayed first clock signal is delayed relative to transitions of the plurality of clock signals;
wherein the first multiplexer is configured to be responsive to the plurality of clock signals to sequentially provide the data values representative of the data values for the first subset of input signal lines to the first output signal line and to sequentially provide the data values representative of the data values for the second subset of input signal lines to the second output signal line; and
wherein the second multiplexer is configured to be responsive to the delayed first clock signal to provide data values representative of the data values from the first output signal line and the second output signal line of the first multiplexer to its output signal line in an alternating manner responsive to the delayed first clock signal.

23. The apparatus of claim 22, wherein the plurality of clock signals contains N clock signals, and wherein the clock divider is configured to generate the plurality of clock signals such that each clock signal of the N clock signals has a duty cycle of 2/N, each clock signal of the N clock signals has a frequency of 2/N times a frequency of the first clock signal, and the clock signals of the N clock signals are shifted in phase from one another by 360/N degrees.

24. The apparatus of claim 23, wherein the first multiplexer is a N:2 multiplexer.

25. The apparatus of claim 24, wherein the N:2 multiplexer is configured as two (N/2):1 multiplexers.

26. The apparatus of claim 22, wherein the second multiplexer comprises:
a first tri-state inverter having an input connected to receive data values from the first output signal line of the first multiplexer, and having an output connected to the output signal line of the second multiplexer; and
a second tri-state inverter having an input connected to receive data values from the second output signal line of the first multiplexer, and having an output connected to the output signal line of the second multiplexer.

27. The apparatus of claim 22, further comprising:
an array of memory cells;
a page buffer configured to store data values sensed from the array of memory cells; and
a first-in-first-out configured to receive pluralities of data values from the page buffer and to provide the received pluralities of data values to the plurality of input signal lines of the first multiplexer on a first-in-first-out basis.

28. The apparatus of claim 27, wherein the data values of each plurality of data values of the pluralities of data values correspond to a particular digit position of a respective plurality of data words stored in the page buffer.

* * * * *